United States Patent
Takano

(10) Patent No.: US 6,502,216 B1
(45) Date of Patent: Dec. 31, 2002

(54) MEMORY DEVICE TESTING APPARATUS

(75) Inventor: Katsuhiko Takano, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/471,146

(22) Filed: Dec. 23, 1999

(30) Foreign Application Priority Data

Dec. 24, 1998 (JP) .......................................... 10-368154

(51) Int. Cl.$^7$ ................................................ G06F 11/00
(52) U.S. Cl. ........................ 714/738; 714/718; 714/743
(58) Field of Search ............................... 714/723, 718, 714/738, 719, 720, 743; 365/201; 324/765

(56) References Cited

U.S. PATENT DOCUMENTS

| | | | | |
|---|---|---|---|---|
| 5,831,989 A | * | 11/1998 | Fujisaki | 714/723 |
| 5,854,796 A | * | 12/1998 | Sato | 714/718 |
| 5,862,088 A | * | 1/1999 | Takemoto et al. | 365/201 |
| 6,061,813 A | * | 5/2000 | Goishi | 714/718 |
| 6,369,601 B1 | * | 4/2002 | Ishigaki | 324/765 |

FOREIGN PATENT DOCUMENTS

JP        10-31899        2/1998

* cited by examiner

*Primary Examiner*—David Ton
(74) *Attorney, Agent, or Firm*—Rosenthal & Osha L.L.P.

(57) ABSTRACT

A memory device testing apparatus for testing a memory device (62) has a failure analysis memory unit (80) which includes: a data storing memory (12), in which fail data (26) output from a comparator (70) is written to an address corresponding to an address of a failure spot in the memory device (62), and a compact memory (14) in which failure information, which indicates that there is a failure spot in the memory device (62), is written based on the fail data (26) that was previously written to the data storing memory (12).

16 Claims, 9 Drawing Sheets

MEMORY DEVICE TESTING APPARATUS

This patent application claims priority based on a Japanese patent application, H10-368154 filed on Dec. 24, 1998, the contents of which are incorporated herein by reference.

BACKGROUND OF THE INVENTION

1. Field of the Invention

The present invention relates to a memory device testing apparatus for testing a memory device. In particular, the present invention relates to a memory device testing apparatus comprising a failure analysis memory unit that can change the dividing method of an address space of a data storing memory.

2. Description of the Related Art

FIG. 1 shows a block diagram of a conventional memory 10 in a failure analysis memory unit for storing fail data output from a comparator. This memory 10 has a data storing memory 12, a compact memory 14, a compact memory address generator 16, and a bus controller 18. The data storing memory 12 has at least two memories and has the same word number and bit size as the entire memory under test. The compact memory 14 has an extremely small capacity compared to the data storing memory 12. The data storing memory 12 is divided into a plurality of partial address spaces for future failure analysis of the memory under test. The compact memory 14 has a plurality of addresses, each corresponding to a plurality of the partial address spaces of the data storing memory 12.

In the memory device testing apparatus, fail data, which is output from the comparator, and an address signal, which indicates the address for storing the fail data, are input to the memory 10. A lower address signal 20 constituted by a lower bit of the address signal is input to the address pin (AD) and the compact memory address generator 16. Furthermore, an upper address signal 22 constituted by an upper bit of the address signal is input to the chip select pin (CS) of the data storing memory 12 and the compact memory address generator 16. Using the upper address signal 22, one of a plurality of memories, which constitutes the data storing memory 12, is selected. The compact memory address generator 16 generates an address which accesses the compact memory 14 based on the lower address signal 20 and the upper address signal 22. This address corresponds to the partial address space of the data storing memory 12.

A write control signal 24 is input to the write enable pin (WE) of the data storing memory 12 and the compact memory 14. The bus controller 18 outputs the fail data signal 26 to the data storing memory 12 and the data input pin (DI) of the compact memory 14. In the conventional memory 10, by inputting the above signals to the data storing memory 12 and the compact memory 14, the fail data is input to the data storing memory 12, and the failure information is written into the compact memory 14. The failure information indicates that there is a failure spot in the partial address space.

Recently, high-capacity, highly integrated memory devices have been developed. The memory to be tested by the memory device testing apparatus may often be a newly developed bulk memory. If the memory device as a whole is determined a failure when there is even just one failed cell inside the high-capacity, highly integrated memory device, the yield factor is very low. Therefore, there is a method of replacing the failed cell with a spare memory cell by providing the memory device with spare cells beforehand. According to this method, by replacing the failed cell with a spare cell during the manufacturing process of the memory device, a memory device that is not considered a complete failure can be manufactured.

As one of the means of replacement of the failed cell using the above method, a memory failure relief analyzer is provided on the memory device testing apparatus. This memory failure relief analyzer retrieves the address of the failed cell in the memory device and finds a solution such designation of the spare cell to be used for replacing the retrieved failed cell. The memory failure relief analyzer receives the fail data from the data storing memory 12 based on the failure data stored in the compact memory 14 of the failure analysis memory unit. If the failure information is stored in the address of the compact memory 14, the memory failure relief analyzer receives the data in the corresponding partial address space of the data storing memory 12. Contrary to this, if the failure information is not stored in the address of the compact memory 14, the memory failure relief analyzer does not receive the data in the corresponding partial address space of the data storing memory 12.

The failure analysis memory unit and the memory failure relief analyzer can exist as different units and can be connected to each other by a cable. By using the information stored in the compact memory 14, unnecessary data is not transferred. This reduces the data transfer time due to the cable provided between the failure analysis memory unit and the memory failure relief analyzer.

According to the configuration of the conventional memory 10 shown in FIG. 1, the fail data can be written into the compact memory 14 only when the memory under test is actually being tested. Therefore, when changing the dividing method of the address space of the data storing memory 12 and writing the failure data for every partial address space in the compact memory 14, the memory under test has to be tested repeatedly with each change in the settings of the compact memory address generator 16. Generally, the checks on writing/reading for each memory cell and the checks for interference with other nearby memory cells are carried out during the testing of the memory itself. Therefore, if the number of addresses in the memory under test is N, the time for testing the memory under test is proportional to approximately the square of N.

Depending on the dividing method of the address space of the data storing memory 12, the failure information will be stored in many or all of the addresses in the compact memory 14. In this situation, all the memory data stored in the data storing memory 12 is transferred to the memory failure relief analyzer. Therefore, the data transfer time from the failure analysis memory unit to the memory failure relief analyzer cannot be reduced. It is therefore less useful to provide the compact memory 14 in the memory 10.

Furthermore, according to the configuration of the conventional memory 10, the memory under test has to be tested again to change the dividing method of the address space of the data storing memory 12, and to write the failure information of every new partial address space into the compact memory 14. Because this re-testing takes so much time, it is not the preferred method for changing the dividing method of address space and re-generating the data of the compact memory 14.

Therefore, it is desired to provide a failure analysis memory unit which can change the dividing method of the address space of the data storing memory 12 without re-testing of the memory device testing apparatus. Furthermore, for a purpose other than the memory failure relief, by making the dividing method of the address space changeable, the memory device testing apparatus can be highly versatile with wider applications.

SUMMARY OF THE INVENTION

Therefore, it is an object of the present invention to provide a memory device testing apparatus having a failure analysis memory unit which overcomes the above issues in the related art. This object is achieved by combinations described in the independent claims. The dependent claims define further advantageous and exemplary combinations of the present invention.

According to the first aspect of the present invention, a memory device testing apparatus for testing a memory device can be provided. The memory device testing apparatus comprises: a pattern generator which generates an address signal that indicates an address of the memory device, an input pattern signal to be input to the memory device, and an expectation value pattern signal to be read out from the memory device based on the input pattern signal; a signal input/output unit which provides the input pattern signal to the address indicated by the address signal of the memory device and outputs an output pattern signal from the address of the memory device; a comparator which compares the output pattern signal output from the memory device with the expectation value pattern signal output from the pattern generator and outputs fail data which indicates the existence of a failure when there is a failure spot in the memory device; and a failure analysis memory unit which has: a data storing memory, in which the fail data output from the comparator is written into an address corresponding to the address of the failure spot in the memory device, and a compact memory in which the failure information, which indicates that there is the failure spot in the memory device, is written based on the fail data that was already written into the data storing memory.

The memory device testing apparatus can be provided such that the failure analysis memory unit may have a compact memory address generator which sets a dividing method for dividing the data storing memory into at least two divided address spaces. The compact memory address generator may generate addresses of the compact memory corresponding to each of the divided address spaces. The failure analysis memory unit may have a data line for inputting the fail data, which is written into the data storing memory, to the address of the compact memory generated by the compact memory address generator.

The memory device testing apparatus can be provided such that the failure analysis memory unit may have a bus controller which outputs a read control signal to the data storing memory and outputs a write control signal to the compact memory. The failure analysis memory unit may have a multiplexer which outputs to the compact memory either the fail data already written into the data storing memory or the fail data to be written to the data storing memory. The failure analysis memory unit may have a data processor which receives memory data output from the data storing memory. The data processor provides the fail data to the compact memory when the data processor detects that the received memory data is fail data.

According to the second aspect of the present invention, a memory device testing method which tests a memory device using data storing memory that stores data can be provided. The memory testing method comprises steps of generating an address signal which indicates an address of the memory device and an input pattern signal to be input to the memory device; providing the input pattern signal to the address indicated by the address signal of the memory device; outputting fail data, which indicates the existence of a failure, if there is a failure spot in the memory device when comparing the output pattern signal output from the address of the memory device based on the input pattern signal, with an expectation value pattern signal to be read out from the memory device based on the input pattern signal; writing the output fail data into an address of the data storing memory which corresponds to the address having the failure spot in the memory device; and writing failure information, which indicates that there is a failure spot in the memory device, into a compact memory having a smaller capacity than the data storing memory based on the fail data that was previously written to the data storing memory.

This summary of the invention does not necessarily describe all necessary features so that the invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
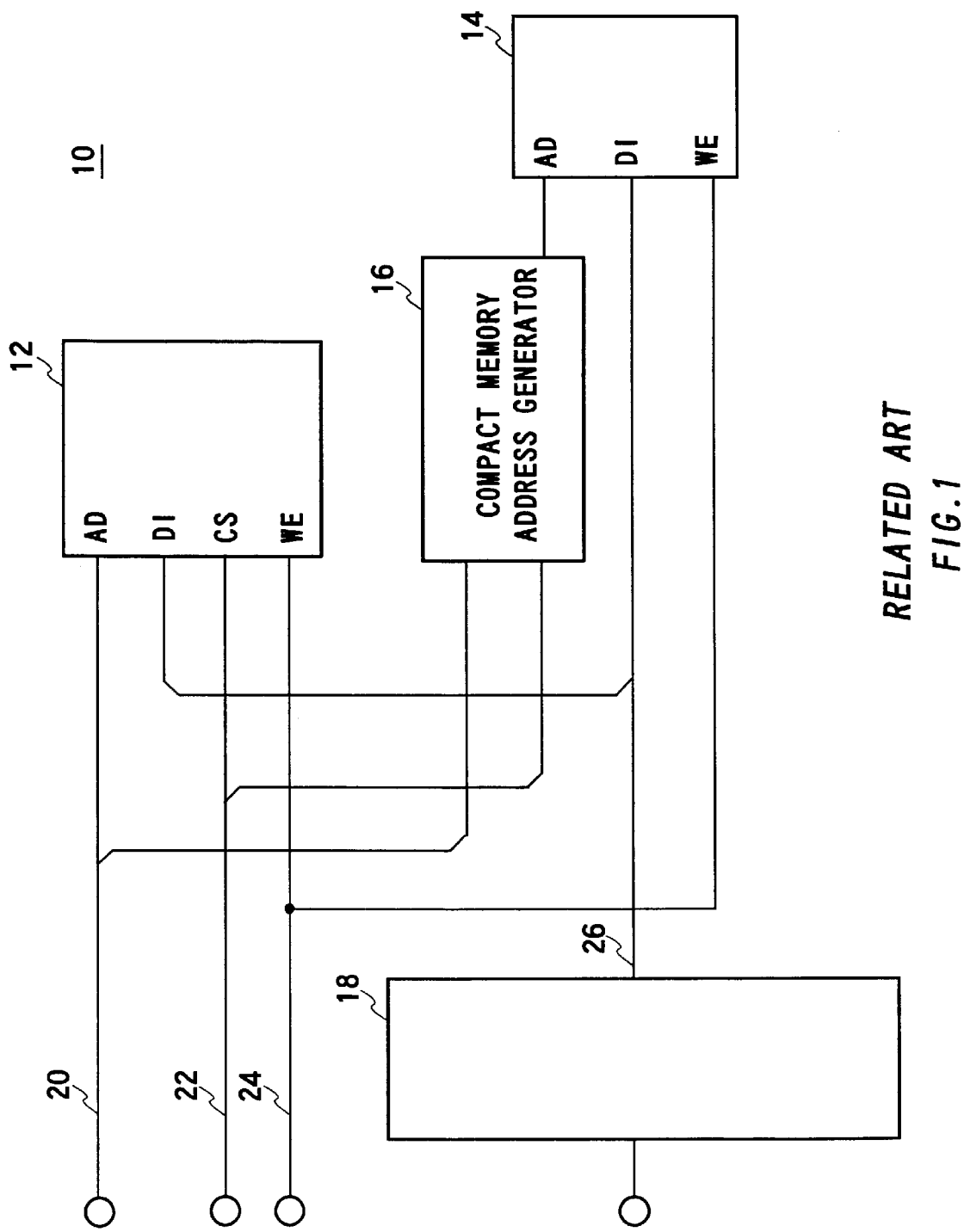
FIG. 1 shows a block diagram of the conventional memory 10 in the failure analysis memory unit.
Figure 2:
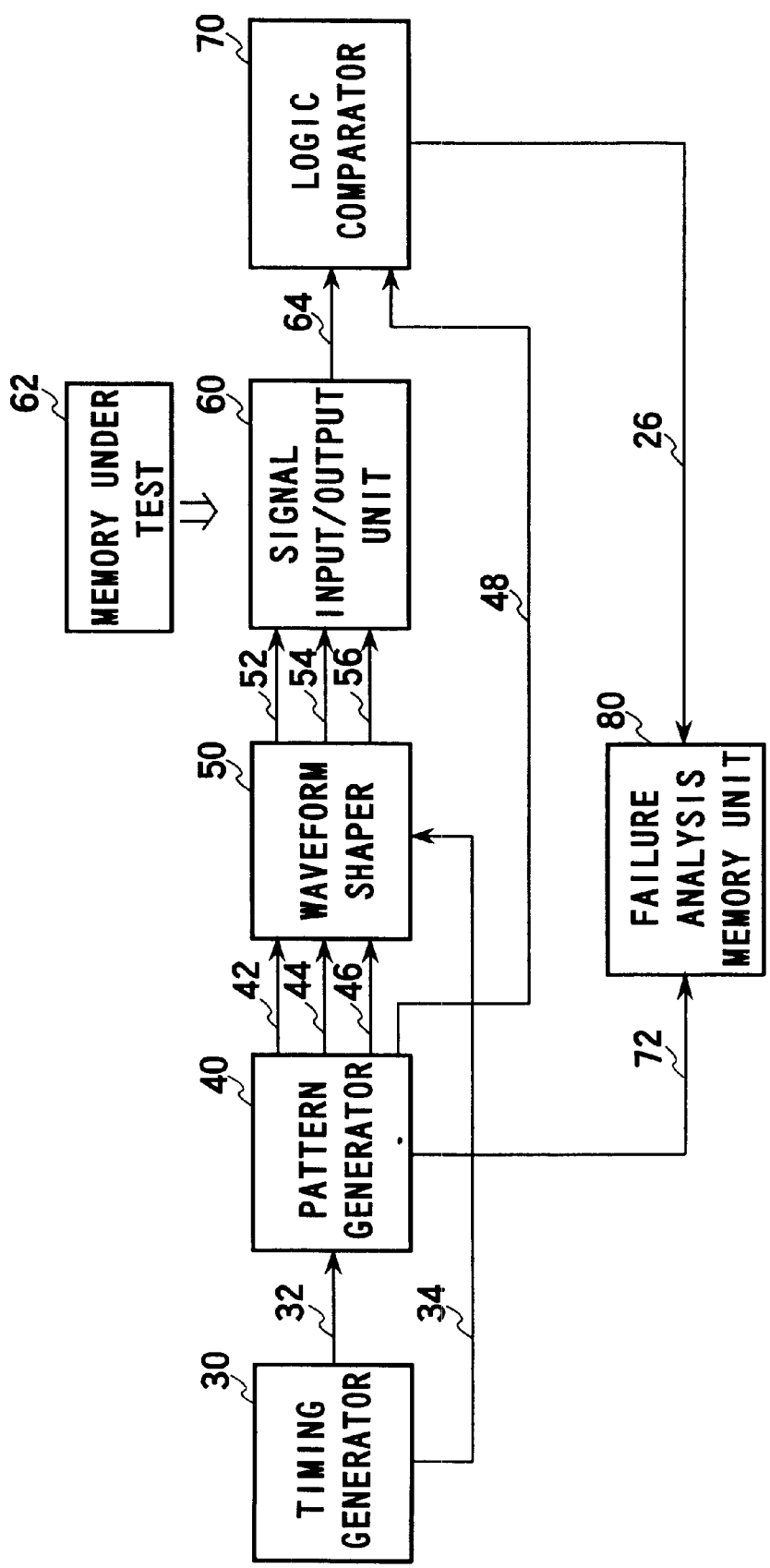
FIG. 2 shows a memory device testing apparatus for testing a memory under test 62.

FIG. 2 shows a memory device testing apparatus for testing a memory under test 62. This memory device testing apparatus has a timing generator 30, a pattern generator 40, a waveform shaper 50, a signal input/output unit 60, a logic comparator 70, and a failure analysis memory unit 80.

The pattern generator 40 generates a control signal 42, an address signal 44, and an input pattern signal 46 according to a reference clock signal 32 generated by the timing generator 30. The control signal 42 requests the signal input/output unit 60 to write data to the memory under test 62. The address signal 44 indicates the address of the memory under test 62. The input pattern signal 46 expresses the test data, which is to be input to the memory under test 62. The control signal 42, the address signal 44, and the input pattern signal 46 generated from the pattern generator 40 are input to the waveform shaper 50.

The waveform shaper 50 shapes the waveforms of the control signal 42, the address signal 44, and the input pattern signal 46 based on the waveform timing signal 34 generated by the timing generator 30. The shaping of the waveforms adjusts the waveforms to the characteristics of the memory under test 62. The waveform shaper 50 outputs to the signal input/output unit 60 the control signal 52, the address signal 54, and the input pattern signal 56 the waveforms of which are shaped.

The control signal 52, which is a write request signal, and the address signal 54 are each input into a control pin and an address pin of the memory under test 62 that are inserted into the signal input/output unit 60, respectively. The input pattern signal 56 is input to a data input/output pin of the memory under test 62. The signal input/output unit 60 provides the input pattern signal 56 to an address indicated by the address signal 54 of the memory under test 62. The timing for input of the control signal 52, the address signal 54, and the input pattern signal 56 into the memory under test 62 is determined by the waveform shaper 50.

After the input pattern-signal 56 is written into the memory under test 62, the pattern generator 40 generates the control signal 42, which requests the signal input/output unit 60 to read the data from the memory under test 62, and the address signal 44. The waveforms of the control signal 42 and the address signal 44, which are generated from the pattern generator 40, are shaped by the waveform shaper 50. The control signal 52 and the address signal 54, the waveforms of which are shaped, are each input to the control pin and the address pin of the memory under test 62 from the signal input/output unit 60, respectively. The signal input/output unit 60 receives the output pattern signal 64, which is output from the address of the memory under test 62 based on the input pattern signal 56, and outputs the output pattern signal 64 to the logic comparator 70.

If the output pattern signal 64 is output to the logic comparator 70, the pattern generator 40 generates an expectation value pattern signal 48 based on the input pattern signal 56. The expectation value pattern signal 48 is the signal expected to be read out from the memory under test 62. The expectation value pattern signal 48 is output to the logic comparator 70. The expectation value pattern signal 48 has the same signal pattern as the signal pattern of the input pattern signal 56 written to the memory under test 62. The logic comparator 70 compares the output pattern signal 64 and the expectation value pattern signal 48.

The logic comparator 70 judges that the memory under test 62 does not have a failure if the output pattern signal 64 and the expectation value pattern signal 48 match. The logic comparator 70 judges that the memory under test 62 has a failure spot if the output pattern signal 64 and the expectation value pattern signal 48 do not match. The logic comparator 70 is an exclusive or circuit. The logic comparator 70 outputs fail data "1", which indicates the existence of the failure because the value of the output pattern signal 64 and the expectation value pattern signal 48 are different.

When there is a failure in the memory under test 62, the fail data signal 26 output from the logic comparator 70 is written into the address designated by the address signal 72 of the failure analysis memory unit 80. The address designated by the address signal 72 corresponds to the address of the failure spot in the memory under test 62. The fail data signal 26 written into the failure analysis memory unit 80 is transferred to the memory failure relief analyzer, not shown in the figure, through a cable. The memory failure relief analyzer then finds a solution for relieving the failure.

Figure 3:
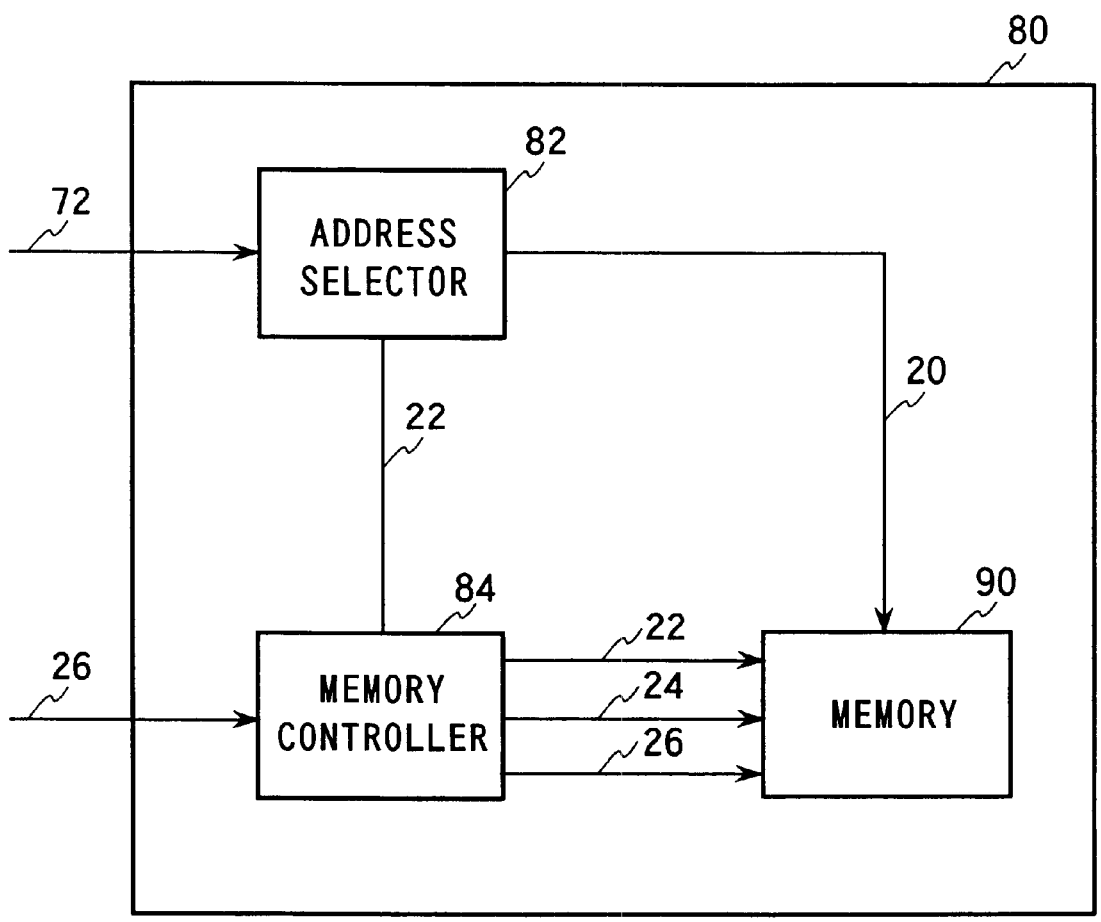
FIG. 3 shows the block diagram of the failure analysis memory unit 80 of the memory device testing apparatus.

FIG. 3 shows a block diagram of the failure analysis memory unit 80 of the memory device testing apparatus. The failure analysis memory unit 80 has an address selector 82, a memory controller 84, and a memory 90. The address signal 72 is provided to the address selector 82. The address selector 82 divides the address signal 72 into an upper address signal 22 and a lower address signal 20. The upper address signal 22 is constituted by the upper bit of the of the address signal 72. The lower address signal 20 is constituted by the lower bit of the address signal 72. The lower address signal 20 is provided to the memory 90.

The upper address signal 22 is provided to the memory controller 84. The fail data signal 26 is also provided to the memory controller 84. The memory controller 84 outputs the upper address signal 22, a write control signal 24, and the fail data signal 26 to the memory 90.

Figure 4:
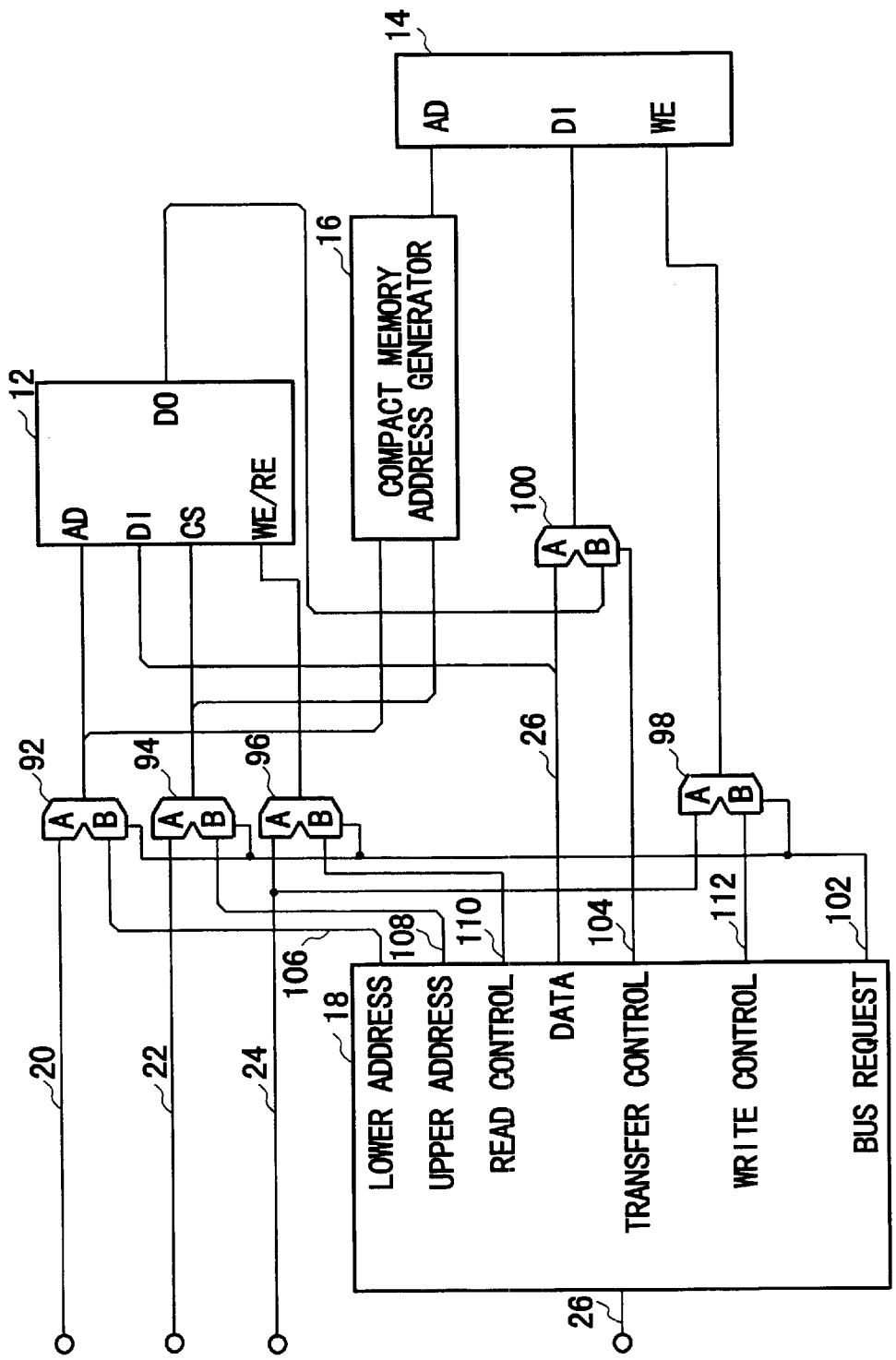
FIG. 4 shows a block diagram of the memory 90 of the first embodiment of the present invention.

FIG. 4 shows a block diagram of the memory 90 of the first embodiment of the present invention. This memory 90 has a data storing memory 12, a compact memory 14, a compact memory address generator 16, a bus controller 18, and multiplexers 92, 94, 96, 98, and 100. The compact memory address generator 16 can set the dividing method which divides the data storing memory 12 into at least two divided address spaces. Furthermore, the compact memory address generator 16 can generate addresses of the compact memory 14 corresponding to each of the divided address spaces. In FIG. 4, the configuration which writes the fail data into the data storing memory 12 and the compact memory 14 is shown, and the configuration which transfers the written fail data outside the memory 90 is not shown.

In this embodiment, the data storing memory 12 is composed of at least two memories. The data storing memory 12 has the same word number and bit size as the entire memory under test 62. When the memory under test 62 is a newly developed bulk memory, the data storing memory 12 is often composed of a plurality of existing memories. In another embodiment, the data storing memory 12 can be composed of a single memory. The compact memory 14 is composed of a single memory having a capacity significantly smaller than the capacity of the data storing memory 12. The compact memory 14 has the same bit size as the bit size of the data storing memory 12.

In this case, the significantly smaller capacity of the compact memory 14 refers not only to the physical capacity of the compact memory 14 being small but also to the small capacity available for storing data even when the compact memory 14 has a large physical capacity. The compact memory 14 can be composed of a plurality of memories. The data storing memory 12 is divided into at least two partial address spaces. The compact memory 14 has a plurality of addresses each corresponding to the plurality of the partial address spaces of the data storing memory 12.

First, the method of writing the fail data signal 26, which is sent from the logic comparator 70 through the memory controller 84, into the data storing memory 12 of the memory 90 and the compact memory 14 is explained. The bus controller 18 provides a bus request signal 102 which requests the multiplexers 92, 94, 96, and 98 to choose an A-side input. The bus controller 18 also provides a transfer control signal 104 to the multiplexer 100 to request the multiplexer 100 to choose an A-side input. Therefore, all the multiplexers 92, 94, 96, and 100 choose the A-side input. As shown in FIG. 3, the lower address signal 20, the upper address signal 22, the write control signal 24, and the fail data signal 26 are provided to the memory 90. The fail data signal 26 is input to the bus controller 18.

The lower address signal 20 is input to the address pin (AD) of the data storing memory 12 and the compact memory address generator 16. The upper address signal 22 which is constituted by the upper bit of the address signal is input to the chip select pin (CS) of the data storing memory 12 and the compact memory address generator 16.

For example, if the memory under test 62 has a capacity of 256 Mbit (32 Mword×8 bit), the data storing memory 12 can be made using four chips of the existing 64 Mbit memories (8 Mword×8 bit). The address signal which accesses the memory under test 62 is generated by the 25 numbers of the address bit. Therefore, in this case, the upper address signal 22, which is an upper 2 bit of the address signal, is used as a chip select signal to select the chip of the data storing memory 12. The lower address signal 20, which is the lower 23 bits of the address signal, is used for an address signal which designates the address of the selected chip.

Furthermore, the data storing memory 12 is divided into at least two partial address spaces. For example, when the data storing memory 12 is divided into the 16 partial address spaces, the compact memory 14 has 16 addresses corresponding to each of the partial address spaces. Therefore, the compact memory address generator 16 generates a 4-bit address signal which accesses the compact memory 14 using 2 bits of the upper address signal 22 and the upper 2 bits of the lower address signal 20. This address signal is input to the address pin (AD) of the compact memory 14

The write control signal 24 is input to the write enable pin (WE) of the data storing memory 12 and the compact memory 14 through the A-side input of the multiplexers 96 and 98. The bus controller 18 outputs the fail data signal 26 to the data input pin (DI) of the data storing memory 12 and the compact memory 14. The fail data signal 26 is input to the data input pin of the compact memory 14 through the multiplexer 100. The fail data is input to the data storing memory 12 and the compact memory 14 by inputting the write control signal 24 and the fail data signal 26 to the data storing memory 12 and the compact memory 14. The failure information, which indicates that a failure spot exists in the corresponding partial address space is then stored in the compact memory 14.

In the data storing memory 12, the fail data is written to the address corresponding to the address of a failure spot in the memory under test 62. The compact memory 14 calculates the logical addition of the failure information already stored and the fail data signal 26. This calculation is made for each address of the compact memory 14 corresponding to the partial address space of the data storing memory 12. For example, when the fail data "00000101" is input to the compact memory 14, which stores the previous failure information "10000100", the compact memory 14 calculates the new failure information as "10000101".

Next, the case of changing the dividing method of the data storing memory 12 and writing the data stored in the data storing memory 12 to the compact memory 14 will be explained. In the above example, the 32 Mword of data storing memory 12 is divided into 16 partial address spaces. Here, the dividing method of the data storing memory 12 is changed so that the partial address spaces of the data storing memory 12 are further divided into 64 address spaces.

The bus controller 18 provides the bus request signal 102 which requests the multiplexers 92, 94, 96 and 98 to choose the B-side input. The bus controller 18 also provides the transfer control signal 104 which requests the multiplexer 100 to choose the B-side input. Therefore, all the multiplexers 92, 94, 96, 98 and 100 choose the B-side input.

The bus controller 18 outputs the lower address signal 106 to the B-side input of the multiplexer 92. The bus controller 18 also outputs the upper address signal 108 to the B-side input of the multiplexer 94. In the data storing memory 12, the upper address signal 108 is input to the chip select pin (CS) as a chip select signal for selecting a chip. The lower address signal 106 is input to the address pin (AD) in the data storing memory 12 as an address signal which indicates the address of the selected chip. The upper address signal 108 and the lower address signal 106 together constitute an address signal which accesses the data storing memory 12. This address signal is increased incrementally from the start address (0) to the end address (32M−1) of the data storing memory 12.

The lower address signal 106 and the upper address signal 108 are input to the compact memory address generator 16. The compact memory address generator 16 can change the dividing method of the data storing memory 12 based on the lower address signal 106 and the upper address signal 108. The compact memory address generator 16 divides the data storing memory 12 into at least two divided address spaces that are different from the partial address space. The partial address space is divided when the fail data input from the logic comparator 70 is written into the data storing memory 12. The compact memory address generator 16 then generates an address of the compact memory 14 corresponding to the newly divided address space.

When inputting the fail data signal 26 provided from the logic comparator 70 to the data storing memory 12, to divide the data storing memory 12 into 16 partial address spaces, the compact memory address generator 16 generates 4 bit of the address signal. In the case of dividing the data storing memory 12 into 64 divided address spaces, the compact memory address generator 16 generates a 6 bit address signal using 2 bits of the upper address signal 108 and the upper 4 bits of the lower address signal 106. For example, in another embodiment, in the case of dividing the data storing memory 12 into 256 divided address spaces, the compact memory address generator 16 can generate an 8 bit address signal using 2 bits of the upper address signal 108 and the upper 6 bits of the lower address signal 106. This address signal is input to the address pin of the compact memory 14.

The bus controller 18 outputs the read control signal 110 to the B-side input of the multiplexer 96. The read control signal 110 is input to the read enable pin (RE) of the data storing memory 12. The data stored in the data storing memory 12 is then read out from the data storing memory 12 based on the lower address signal 106 and the upper address signal 108. The data output pin (DO) of the data storing memory 12 and the data input pin (DI) of the compact memory 14 is connected by the data line.

Furthermore, the bus controller 18 outputs a write control signal 112 to the B-side input of the multiplexer 98. The write control signal 112 is input to the write enable pin (WE) of the compact memory 14. The compact memory 14 then inputs the fail data, which is written into the data storing memory 12, to the address generated by the compact memory address generator 16, through the data line. As explained above, the address which accesses the data storing memory 12 is increased incrementally from the start address (0) to the end address (32M−1), so that all the data is provided to the compact memory 14.

By inputting these signals to the data storing memory 12 and the compact memory 14, the failure information which indicates that there is a failed spot in the memory under test 62 is written into the compact memory 14. This writing is based on the fail data written to the divided address spaces of the data storing memory 12. In this example, fail data stored in 64 divided address spaces is written to the compact memory 14 as failure information for every divided address space.

According to the configuration of the conventional memory 10, to change the dividing method of the address space, the memory under test 62 has to be re-tested to rewrite the data into the compact memory 14. The memory 90 of the present invention can change the dividing method of the address space without re-testing the memory under test 62.

Figure 5:
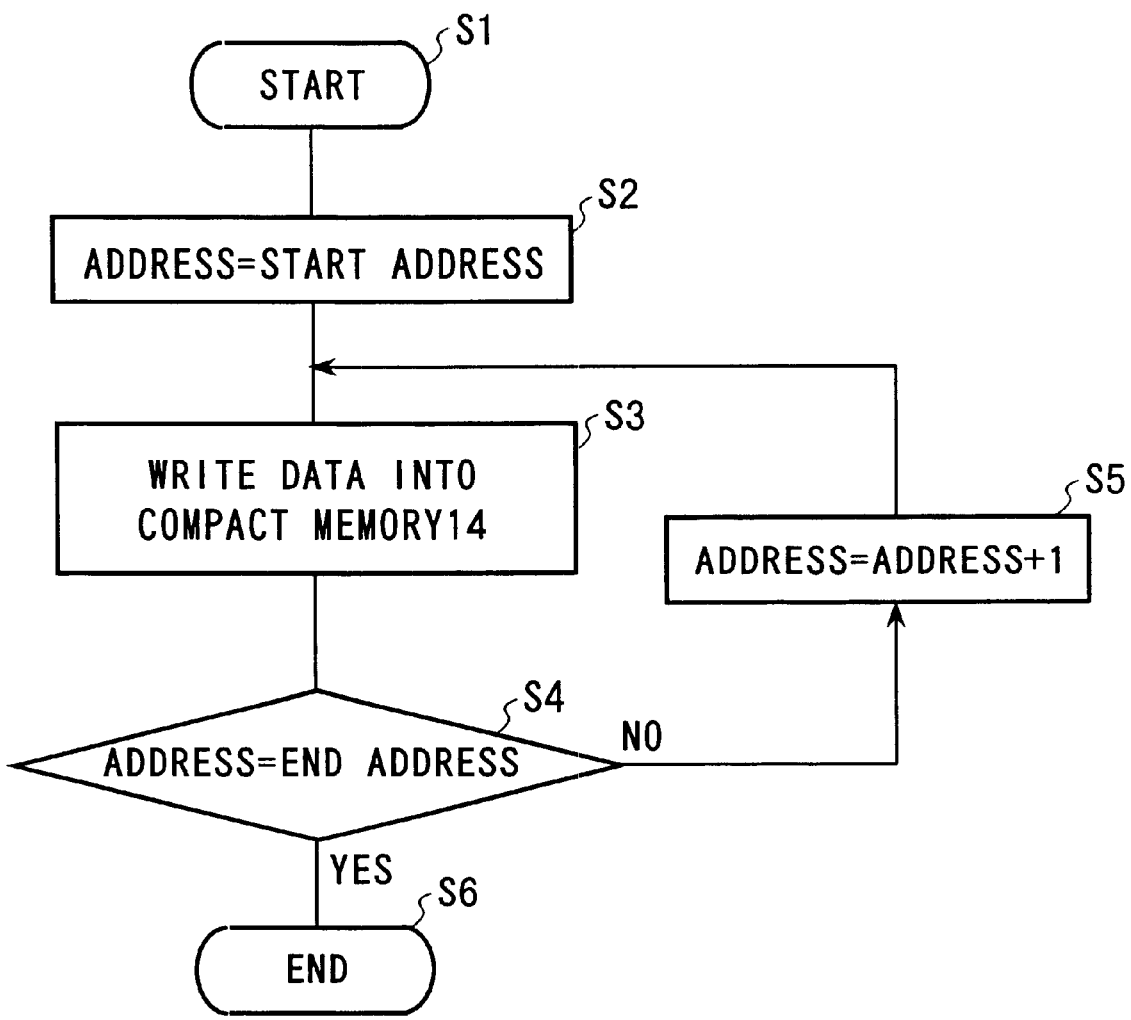
FIG. 5 is a flow chart showing the writing of data stored in the data storing memory 12, to the compact memory 14.

FIG. 5 is a flow chart showing writing of data stored in the data storing memory 12 to the compact memory 14. The address signal for accessing the data storing memory 12 is comprised of the upper address signal 108 and the lower address signal 106.

The generation of an address signal is started at S1. The address is set to a start address (0) at S2. The data stored in the start address of the data storing memory 12 is written into the compact memory 14 at S3. A judgement of whether or not the address is an end address (32M−1) is made at S4. If the address is not an end address, the address is increased incrementally at S5. Then the process returns to step S3. The data stored in the address designated by the S5 is written into the compact memory 14. The address is increased in increments until it is detected at S4 that an end address has been reached. If it is detected at S4 that the end address has been reached, the generation of the address signal is ceased at S6.

The above operation of each step is carried out by pipeline operation. Therefore, the time required for writing the data into the compact memory 14 is approximately proportional to the number of addresses of the memory under test 62. Compared to the conventional method in which the memory under test 62 has to be re-tested to re-write the data of the compact memory 14, the time required for re-writing the data of the compact memory 14 of the present embodiment is much shorter.

Figure 6:
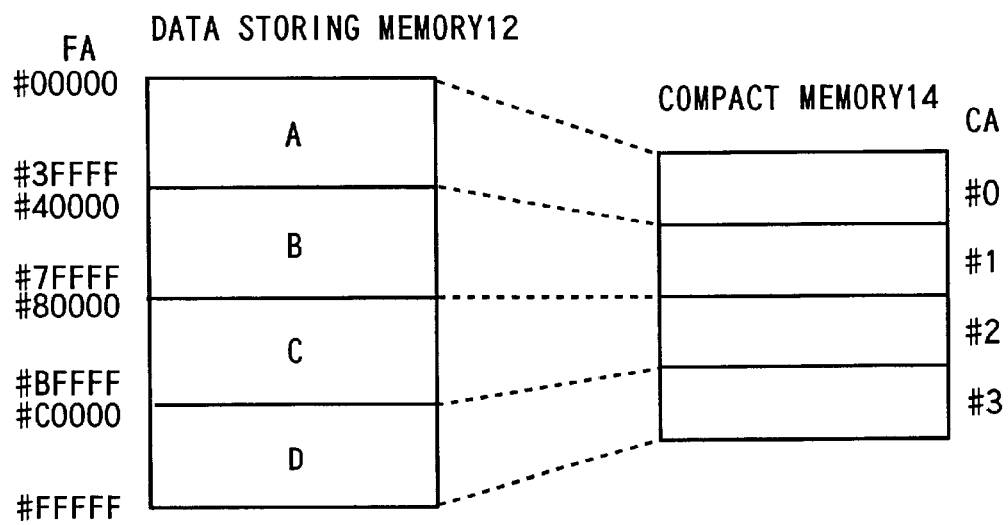
FIG. 6 shows an example which divides the data storing memory 12 into 4 partial address spaces (A to D) and allots each partial address space to one address of the compact memory 14.

FIG. 6 shows an example which divides the data storing memory 12 into 4 partial address spaces (A to D) and allots each partial address space to one address of the compact memory 14. The data storing memory 12 shown in FIG. 6 is a single memory having 1M of word numbers and 4 bit size. Following, FIG. 7 to 9 will also be explained based on this data storing memory 12.

In the embodiment shown in FIG. 6, the address FA of the data storing memory 12 is set as FA0–19, and the address CA of the compact memory 14 is set as CA0–1. For example, by making the address CA0–1 correspond to the address FA18–19 of the data storing memory 12, the data storing memory 12 is divided into four partial address spaces (A–D) and one partial address space is allotted to one address of the compact memory 14. The partial address spaces of FA#00000-3FFFF, #40000-7FFFF, #80000-BFFFF, and #C0000-FFFFF of the data storing memory 12 are each allotted to the addresses #0, #1, #2, and #3 of the compact memory 14, respectively. As another embodiment, the address CA0–1 of the compact memory 14 can corresponded to the desired 2 bits of the address FA0–19 of the data storing memory 12.

When a memory under test 62 having 1M word numbers and 4 bit size has a failed cell, the fail data signal 26 output from the logic comparator 70 is written to the data storing memory 12 and compact memory 14. This writing operation will be explained below. The multiplexers 92, 94, 96, 98 and 100 select the A-side input.

First, the operation of writing the fail data signal 26 to the data storing memory 12 will be explained. The lower address signal 20, the upper address signal 22, and the write control signal 24 are input to each of the address pin (AD), the chip select pin (CS), and the write enable pin (WE), respectively, of the data storing memory 12. The fail data signal 26 is written to the address designated by the lower address signal 20 and the upper address signal 22. In this embodiment, because the data storing memory 12 is a single memory having the same word number and bit size as the memory under test 62, the upper address signal 22 is not output as the chip select signal. Therefore, the fail data signal 26 is written to the address designated by 20 bits of the lower address signal.

Next, the operation of writing the fail data signal 26 to the compact memory 14 will be explained. The compact memory address generator 16 selects an upper 2 bits (FA18–19) of the lower address signal 20, then generates the address signal of the compact memory 14. Therefore, each of the partial address spaces (A–D) of FA#00000-3FFFF, #40000-7FFFF, #80000-BFFFF, and #C0000-FFFFF of the data storing memory 12 are each allotted to the corresponding addresses #0, #1, #2, and #3 of the compact memory 14, respectively. The fail data signals 26 in some of the partial address spaces are written to the corresponding address of the compact memory 14. The compact memory 14 then stores the failure information which indicates that there is a failure spot in the corresponding partial address space. When the fail data signal 26 is written into the compact memory 14, the compact memory 14 calculates the logical addition between the stored failure information and the fail data signal 26.

Figure 7:
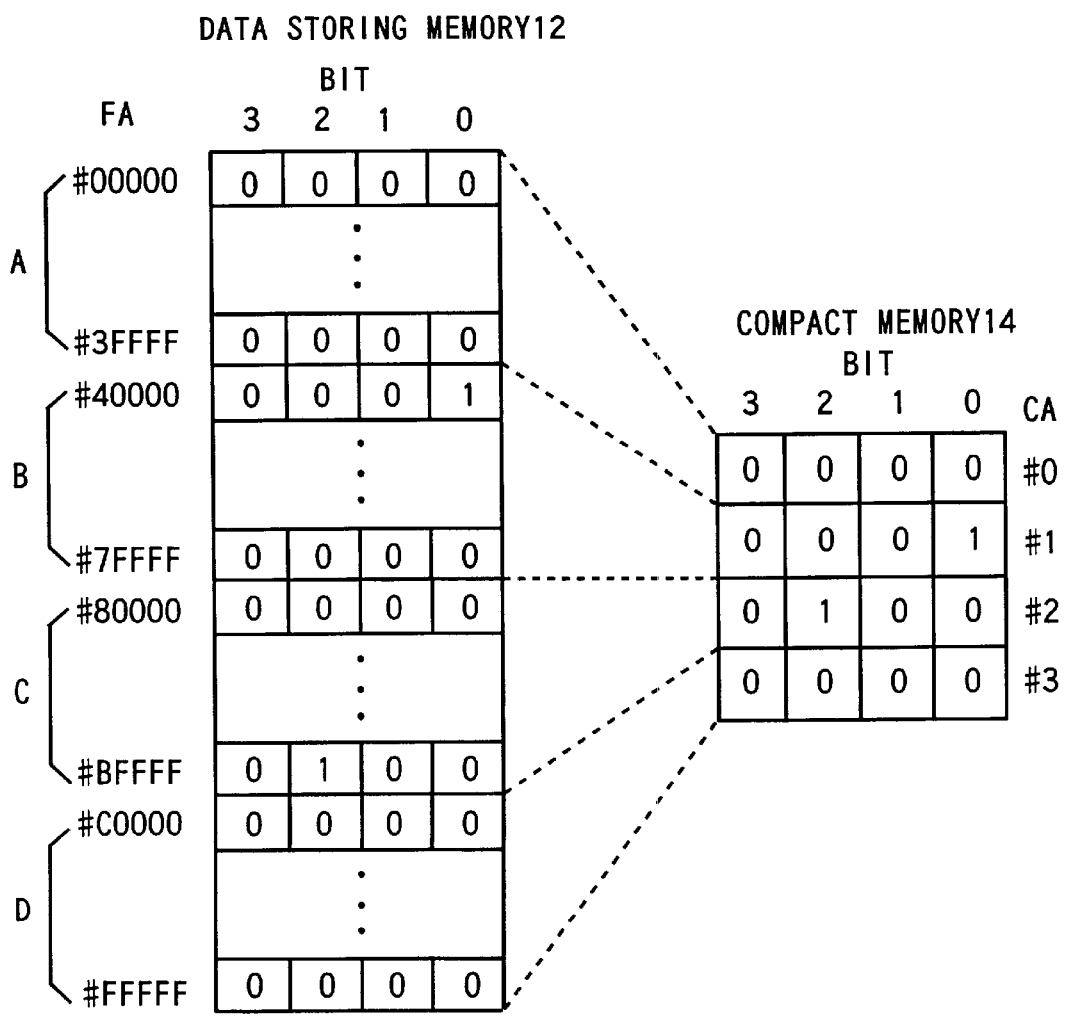
FIG. 7 shows an example of the data storing memory 12 and the compact memory 14.

FIG. 7 shows an example of the data storing memory 12 and the compact memory 14. In FIG. 7, the fail data signal 26 is written into the data storing memory 12 as a result of testing the memory under test 62. Also, in FIG. 7, the failure information, which indicates that there is a failure spot in a part of the partial address space in the data storing memory 12, is stored in the compact memory 14. In FIG. 7, "0" means that the comparison made in the logic comparator 70 matches, and "1" means that the comparison made in the logic comparator 70 does not match. According to this testing result, the bit 0 in the address #40000 and the bit 2 in the address #BFFFF of the memory under test 62 have failed. The failure information, which indicates that there is a failure spot in the bit 0 of the partial address space B and bit 2 of the partial address space C, is written to each of the addresses #1 and #2 of the compact memory 14, respectively.

Based on the data stored in the compact memory 14, it can be established that there are no failure spots in the partial address spaces A and D. Therefore, when transferring the data stored in the data storing memory 12 for later analysis, the data of the partial address spaces A and D without failure spots do not have to be transferred. The time required for transferring the data of the partial address spaces A and D thus can be reduced.

Figure 8:
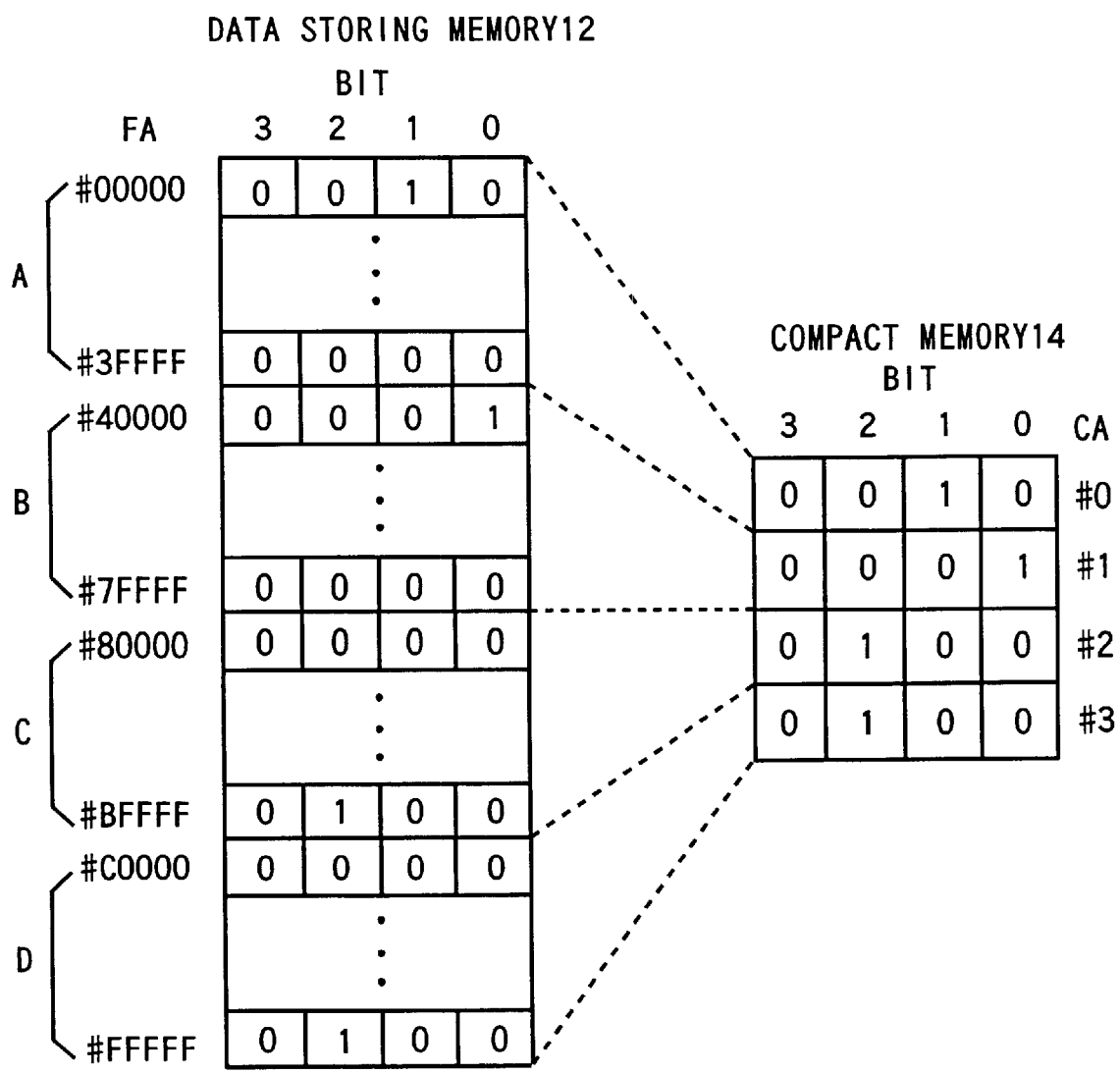
FIG. 8 shows another example of the data storing memory 12 and the compact memory 14.

FIG. 8 shows another example of the data storing memory 12 and the compact memory 14. The fail data signal 26 is written into the data storing memory 12 as a result of testing the memory under test 62. The failure information, which indicates that there are failed spots in all of the partial address spaces in the data storing memory 12, is stored in the compact memory 14. According to this testing result, the bit 1 in the address #00000, the bit 0 in the address #40000, the bit 2 in the address #BFFFF and the bit 2 in the address #FFFFF of the memory under test 62 are failures. The failure information, which indicates that there is a failed spot in bit 1 of the partial address space A, bit 0 of the partial address space B, bit 2 of the partial address space C, and bit 2 of the partial address space D, is then written into each of the addresses #1, #2, #3, and #4 of the compact memory 14, respectively.

In this case, based on the data stored in the compact memory 14, it is established that there are failed spots in all of the partial address spaces A–D. Therefore, according to the data of the compact memory 14, all the data stored in the data storing memory 12 has to be transferred to the memory failure relief analyzer, not shown, for analysis. Therefore, in this case, the time required for transfer of the data from the failure analysis memory unit 80 to the memory failure relief analyzer cannot be reduced.

Figure 9:
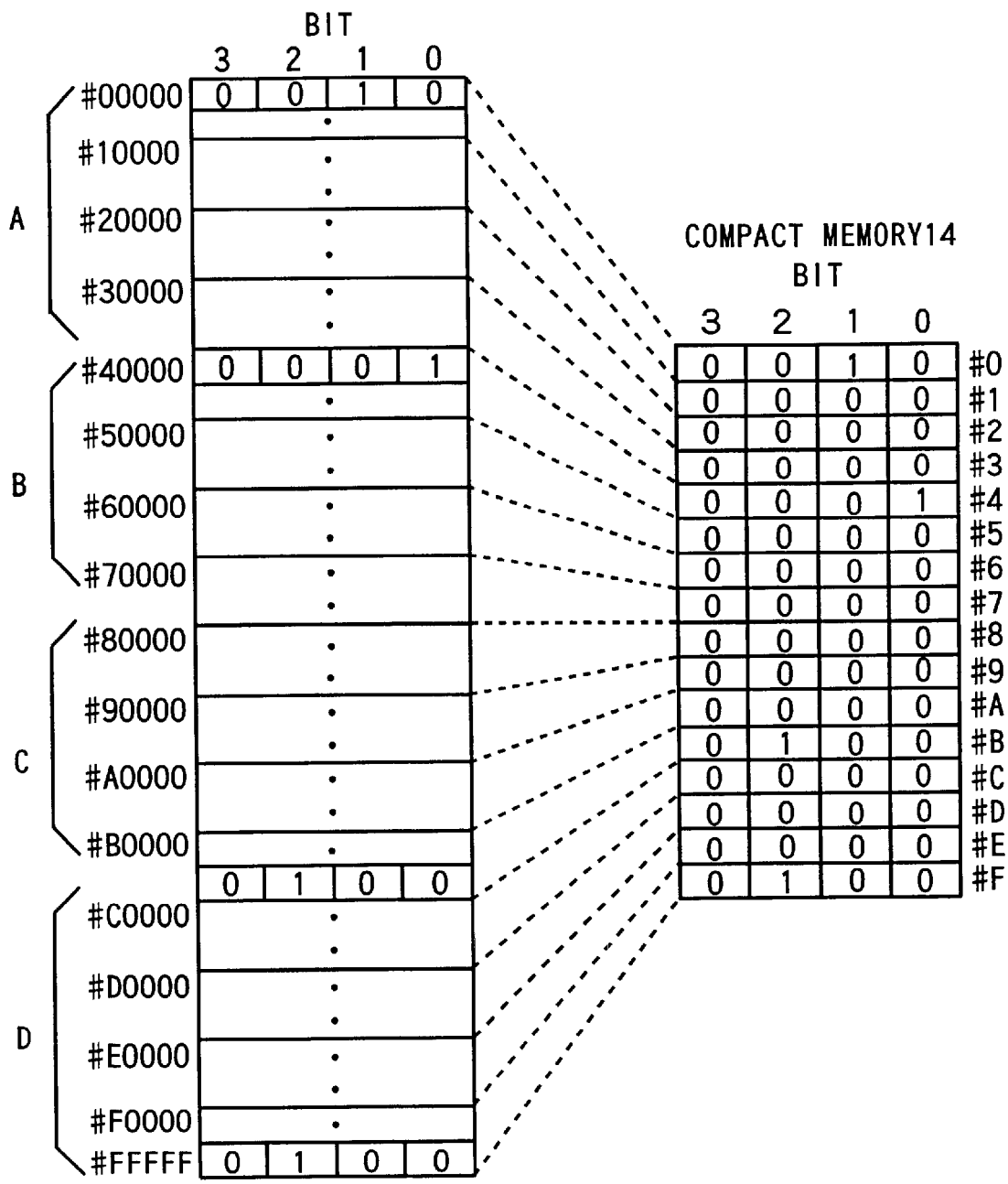
FIG. 9 shows further another example of the data storing memory 12 and the compact memory 14.

FIG. 9 shows further another example of the data storing memory 12 and the compact memory 14. In FIG. 9, the data storing memory 12 has a divided address space in which each of the partial address spaces (A–D) shown in FIG. 8 are further divided into four parts. The compact memory 14 corresponds to the data storing memory 12. As shown in FIG. 8, bit 1 in the address #00000, bit 0 in the address #40000, bit 2 in the address #BFFFF, and bit 2 in the address #FFFFF are failures.

In the partial address space A, each of the divided address spaces of FA#00000-0FFFF, #10000-1FFFF, #20000-2FFFF, and #30000-3FFFF of the data storing memory 12 are allotted to the addresses #0, #1, #2, and #3 of the compact memory 14, respectively. Similarly, in the partial address space B, each of the divided address spaces of FA#40000-4FFFF, #50000-5FFFF, #60000-6FFFF, and #70000-7FFFF of the data storing memory 12 are allotted to the addresses #4, #5, #6, and #7 of the compact memory 14, respectively. Similarly, in the partial address space C, each of the divided address spaces of FA#80000-8FFFF, #90000-9FFFF, #A0000-AFFFF, and #B0000-BFFFF of the data storing memory 12 are allotted to the addresses #8, #9, #A, and #B of the compact memory 14, respectively. Similarly, in the partial address space D, each of the divided address spaces of FA#C0000-CFFFF, #D0000-DFFFF, #E0000-EFFFF, and #F0000-FFFFF of the data storing memory 12 are allotted to the addresses #C, #D, #E, and #F of the compact memory 14, respectively.

As shown in FIG. 9, the failure information is written to the addresses #0, #4, #B, and #F of the compact memory 14. It follows that the failure information is not written to the addresses #1–#3, #5–#A, and #C–#E of the compact memory 14. Therefore, it can be established that fail data does not exist in the divided address spaces of the data storing memory 12 corresponding to the addresses into which the fail information was not written. In the transfer of data to the memory failure relief analyzer, only the data of the divided address spaces of FA#00000-0FFFF, #40000-4FFFF, #B0000-BFFFF, and #F0000-FFFFF of the data storing memory 12 has to be transferred.

In this case, the quantity of data transferred is one fourth of the quantity of data transferred in the example of FIG. 8. In FIG. 9, the data storing memory 12 is divided into the 16 divided address spaces. For example, if the data storing memory 12 is divided into 64 divided address spaces, the data transfer quantity is further reduced to one fourth of the quantity of data transferred when the data storing memory 12 was divided into 16 address spaces.

Figure 10:
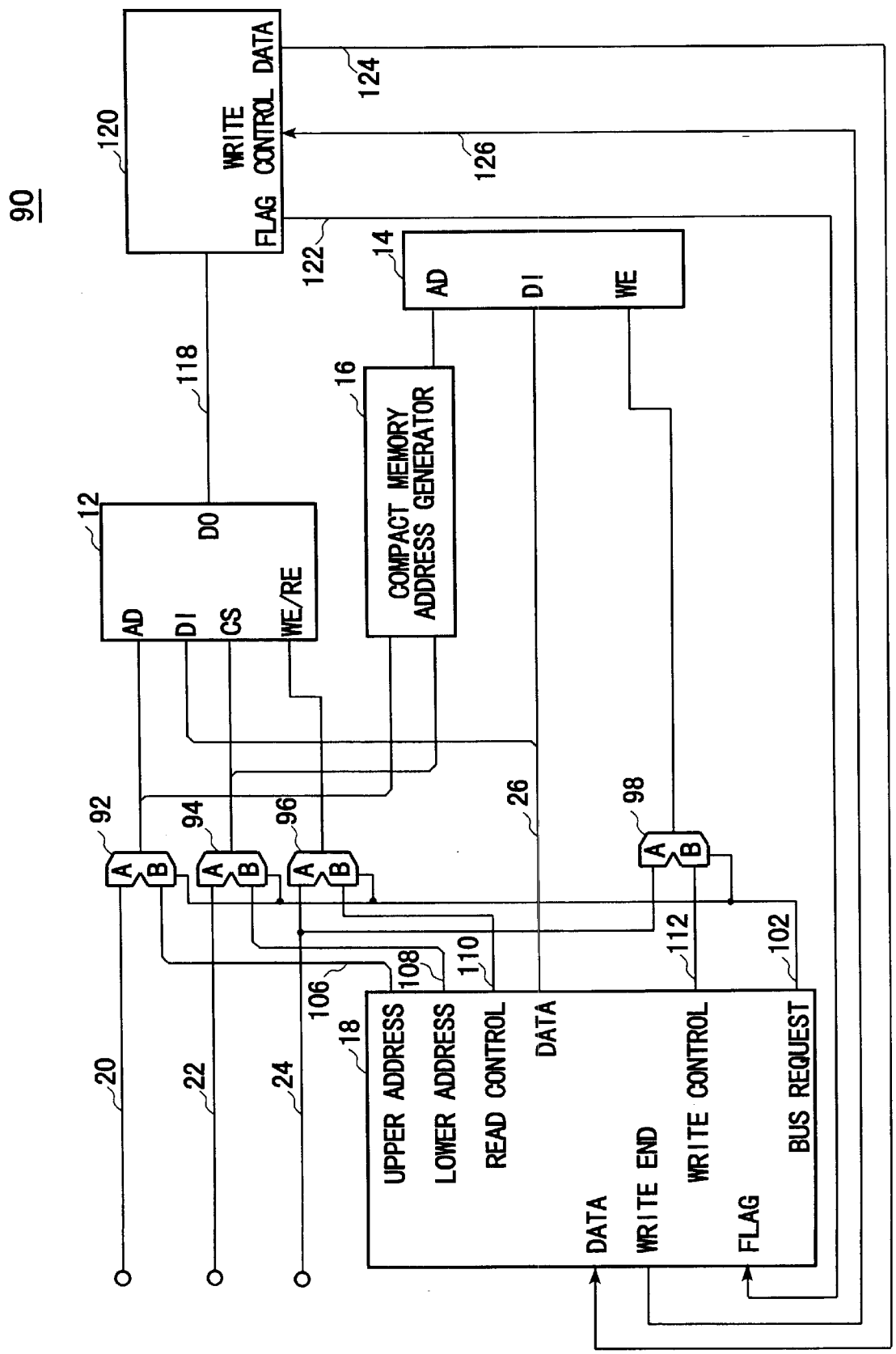
FIG. 10 shows a block diagram of the memory 90 of the second embodiment of the present invention.

FIG. 10 shows a block diagram of the memory 90 of the second embodiment of the present invention. This memory 90 comprises a data storing memory 12, a compact memory 14, a compact memory address generator 16, a bus controller 18, multiplexers 92, 94, 96, and 98, and a data processor 120. The same codings are provided on elements having the same function as elements shown in FIG. 4. The operation, which writes the fail data output from the logic comparator 70 into the data storing memory 12 and the compact memory 14 through the memory controller 84, is the same as the operation explained in FIG. 4.

The operation, which changes the dividing method of the data storing memory 12 and writes the data stored in the data storing memory 12 to the compact memory 14, will be explained. The bus controller 18 provides a bus request signal 102 which requests the multiplexers 92, 94, 96, and 98 to choose the B-side input. Therefore, all the multiplexers 92, 94, 96, and 98 choose the B-side input.

The bus controller 18 outputs a lower address signal 106 to the B-side input of the multiplexer 92 and outputs an upper address signal 108 to the B-side input of the multiplexer 94. In the data storing memory 12, the upper address signal 108 is input to the chip select pin as the chip select signal for selecting the chip. The lower address signal 106 is input to the address pin as an address signal which indicates the address of the selected chip.

The lower address signal 106 and the upper address signal 108 are input to the compact memory address generator 16. The compact memory address generator 16 can change the dividing method of the data storing memory 12 based on the lower address signal 106 and the upper address signal 108. The compact memory address generator 16 also generates addresses of the compact memory 14 which correspond to the divided address spaces.

The bus controller 18 outputs a read control signal 110 to the B-side input of the multiplexer 96. The read control signal 110 is input to the read enable pin of the data storing memory 12. The data stored in the data storing memory 12 is read out based on the lower address signal 106 and the upper address signal 108. The read out memory data 118 is sent to the data processor 120. The data processor 120 detects whether or not the memory data 118 of the data storing memory 12 is "1". If the memory data 118 of the data storing memory 12 is "1", the data processor 120 provides to the bus controller 18 a flag signal 122 and a fail data 124, which indicate a failure. When the bus controller 18 receives the flag signal 122, the bus controller 18 sends a fail data signal 26, which corresponds to the fail data 124, to the data input pin (DI) of the compact memory 14. The fail data signal 26 is written to the address of the compact memory 14 generated by the compact memory address generator 16.

When writing of the fail data signal 26 is finished, the bus controller 18 sends the write end signal 126 to the data processor 120 and resets the flag. By repeating the above operation from the start address to the end address of the data storing memory 12, the fail data stored in the data storing memory 12 is written to the corresponding address of the compact memory 14.

In the embodiments of the present invention, the data storing memory 12 is divided for the purpose of reducing the quantity of data transferred to the memory failure relief analyzer. However, the purpose of dividing the data storing memory 12 is not limited to reducing the quantity of data transferred. The configuration of the present invention can be used when data stored in the data storing memory 12 is transferred to the compact memory 14 when off-line with other units outside the memory 90.

In the embodiments of the present invention shown above, the example of further re-dividing the data storing memory 12 is explained. The present invention includes all embodiments which change the dividing method. Therefore, an embodiment which changes the address space of the data storing memory 12 to a larger divided address space can be included in the scope of the present invention. An embodiment which changes the direction of the division without changing the magnitude of the space can be also included in the scope of the present invention.

As is made clear from the above explanation, the dividing method of the address space of the data storing memory 12 can be easily changed according to the present invention. The time required for generating the data of the compact memory thus can be reduced.

Although the present invention has been described by way of exemplary embodiments, it should be understood that many changes and substitutions may be made by those skilled in the art without departing from the spirit and the scope of the present invention which is defined only by the appended claims.

What is claimed is:

1. A memory device testing apparatus for testing a memory device comprising:
    a pattern generator which generates an address signal that indicates an address of said memory device, an input pattern signal to be input to said memory device, and an expectation value pattern signal to be read out from said memory device based on said input pattern signal;
    a signal input/output unit which provides said input pattern signal to said memory device at said address indicated by said address signal and outputs an output pattern signal from said address of said memory device;
    a comparator which compares said output pattern signal output from said memory device with said expectation value pattern signal output from said pattern generator and outputs fail data which indicates existence of a failure when there is a failure spot in said memory device; and
    a failure analysis memory unit which has:
        a data storing memory, in which said fail data output from said comparator is written into an address corresponding to said address of said failure spot in said memory device, and
        a compact memory, input of which is electrically connected to an output of said data storing memory, and a failure information, which indicates that there is said failure spot in said memory device, is written into said compact memory based on said fail data that is previously written into and read out from said data storing memory.

2. A memory device testing apparatus as claimed in claim 1, wherein said failure analysis memory unit has a compact memory address generator which sets a dividing method for dividing said data storing memory into at least two divided address spaces.

3. A memory device testing apparatus as claimed in claim 2, wherein said compact memory address generator generates addresses of said compact memory corresponding to each of said divided address spaces.

4. A memory device testing apparatus as claimed in claim 3, wherein said failure analysis memory unit has a data line for inputting said fail data, which is written into said data storing memory, to said addresses of said compact memory generated by said compact memory address generator.

5. A memory device testing apparatus as claimed in claim 4, wherein said failure analysis memory unit has a bus controller which outputs a read control signal to said data storing memory and outputs a write control signal to said compact memory.

6. A memory device testing apparatus as claimed in claim 5, wherein said failure analysis memory unit has a multiplexer which outputs to said compact memory either said fail data that is written to said data storing memory or said fail data that is to be written to said data storing memory.

7. A memory device testing apparatus as claimed in claim 1, wherein said failure analysis memory unit has a data processor which receives memory data output from said data storing memory, and
    said data processor provides said fail data to said compact memory when said data processor detects that said received memory data is said fail data.

8. A memory device testing apparatus as claimed in claim 1, wherein said compact memory calculates a logical addition of said fail information to be written into said compact memory based on said fail data previously written into and read out from said data storing memory and said fail information previously written into said compact memory.

9. A memory device testing method which tests a memory device using a data storing memory that stores data comprising steps of:
    generating an address signal which indicates an address of said memory device and an input pattern signal which is to be input to said memory device;
    providing said input pattern signal to said memory device at said address indicated by said address signal;
    outputting fail data, which indicates existence of a failure, if there is a failure spot in said memory device after comparison of an output pattern signal, which is output from said address of said memory device based said input pattern signal with a expectation value pattern signal which is to be read out from said memory device based on said input pattern signal;
    writing said fail data to an address of said data storing memory which corresponds to said address having said failure spot in said memory device; and
    writing a failure information, which indicates that there is said failure spot in said memory device, into a compact memory, input of which is electrically connected to an output of said data storing memory, having a smaller capacity than said data storing memory based on said fail data that is previously written into said data storing memory.

10. A memory device testing method as claimed in claim 9, wherein said failure data writing step sets a dividing method for dividing said data storing memory into at least two divided address spaces.

11. A memory device testing method as claimed in claim 10, wherein said failure information writing step generates addresses of said compact memory corresponding to each of said divided address spaces.

12. A memory device testing method as claimed in claim 11, wherein said failure information writing step inputs said fail data, which is written into said data storing memory, to said addresses of said compact memory.

13. A memory device testing method as claimed in claim 12, wherein said failure information writing step outputs a read control signal to said data storing memory and outputs a write control signal to said compact memory.

14. A memory device testing method as claimed in claim 13, wherein said failure information writing step outputs to said compact memory either said fail data that is written to said data storing memory or said fail data that is to be written to said data storing memory.

15. A memory device testing method as claimed in claim 9, wherein said failure information writing step receives memory data output from said data storing memory and provides said fail data to said compact memory when said received memory data is detected as said fail data.

16. A memory device testing method as claimed in claim 9, wherein said compact memory calculates a logical addition of said fail information to be written into said compact memory based on said fail data previously written into and read out from said data storing memory and said fail information previously written into said compact memory.

* * * * *